United States Patent
Elnathan et al.

(10) Patent No.: US 8,208,068 B2
(45) Date of Patent: *Jun. 26, 2012

(54) METHOD, DEVICE AND SYSTEM OF GENERATING A CLOCK SIGNAL CORRESPONDING TO A WIRELESS VIDEO TRANSMISSION

(75) Inventors: Nathan Elnathan, Ra'anana (IL); Shay Freundlich, Givat Ada (IL)

(73) Assignee: Amimon Ltd, Herzlia (IL)

( * ) Notice: Subject to any disclaimer, the term of this patent is extended or adjusted under 35 U.S.C. 154(b) by 234 days.

This patent is subject to a terminal disclaimer.

(21) Appl. No.: 12/310,730

(22) PCT Filed: Sep. 5, 2007

(86) PCT No.: PCT/IL2007/001095
§ 371 (c)(1), (2), (4) Date: Dec. 1, 2009

(87) PCT Pub. No.: WO2008/029402
PCT Pub. Date: Mar. 13, 2008

(65) Prior Publication Data
US 2010/0071010 A1    Mar. 18, 2010

(51) Int. Cl.
*H04N 9/44* (2006.01)
(52) U.S. Cl. ...................................... 348/500
(58) Field of Classification Search .......... 348/723–726, 348/500, 521, 524, 537, 547
See application file for complete search history.

(56) References Cited

U.S. PATENT DOCUMENTS

| | | | | |
|---|---|---|---|---|
| 5,939,947 A * | 8/1999 | Nakao et al. | | 331/11 |
| 6,154,466 A * | 11/2000 | Iwasaki et al. | | 370/466 |
| 6,310,653 B1 * | 10/2001 | Malcolm et al. | | 348/537 |
| 6,404,818 B1 * | 6/2002 | Obikane | | 375/240.28 |
| 6,819,190 B2 * | 11/2004 | Pearce et al. | | 331/57 |
| 7,024,575 B2 * | 4/2006 | Lienhart et al. | | 713/400 |
| 7,064,621 B2 * | 6/2006 | Nakanishi | | 331/57 |
| 7,386,216 B2 * | 6/2008 | Watanabe et al. | | 386/200 |
| 7,511,762 B2 * | 3/2009 | Elnathan et al. | | 348/500 |
| 7,558,326 B1 * | 7/2009 | Lyle et al. | | 375/244 |
| 2006/0209745 A1 * | 9/2006 | MacMullan et al. | | 370/328 |
| 2006/0209890 A1 * | 9/2006 | MacMullan et al. | | 370/468 |
| 2006/0209892 A1 * | 9/2006 | MacMullan et al. | | 370/468 |
| 2006/0212911 A1 * | 9/2006 | MacMullan et al. | | 725/81 |
| 2007/0098063 A1 * | 5/2007 | Reznic et al. | | 375/240.2 |
| 2007/0121550 A1 * | 5/2007 | Wada | | 370/332 |
| 2007/0236605 A1 * | 10/2007 | Saito et al. | | 348/512 |
| 2007/0248320 A1 * | 10/2007 | Watanabe et al. | | 386/94 |

FOREIGN PATENT DOCUMENTS

WO    WO 2006/101801    9/2006
WO    WO 2006/118964    11/2006

OTHER PUBLICATIONS

International Search Report PCT/IL07/01095 dated Sep. 15, 2008.

* cited by examiner

*Primary Examiner* — Paulos Natnael
(74) *Attorney, Agent, or Firm* — Eitan Mehulal & Sadot

(57) ABSTRACT

Some demonstrative embodiments include devices, systems and/or methods of wireless video communication. Some embodiments include a wireless video receiver to receive a wireless video transmission including data representing pixels of a video frame and a synchronization signal indicative of a beginning of the video frame, the wireless receiver including a clock generator to generate a pixel clock signal synchronized to the synchronization signal, wherein a clock rate of the pixel clock signal corresponds to a pixel rate of the pixels. Other embodiments are described and claimed.

12 Claims, 4 Drawing Sheets

METHOD, DEVICE AND SYSTEM OF GENERATING A CLOCK SIGNAL CORRESPONDING TO A WIRELESS VIDEO TRANSMISSION

CROSS-REFERENCE TO RELATED APPLICATIONS

The present application is a US National Phase of PCT Application No. PCT/IL2007/001095, filed on Sep. 5, 2007, which claims the benefit of U.S. application Ser. No. 11/470,582 filed Sep. 6, 2006, the entire disclosures of which are incorporated herein by reference.

FIELD

Some embodiments relate generally to the filed of wireless communication and, more particularly, to generating a clock signal corresponding to a wireless video transmission.

BACKGROUND

Wireless communication has rapidly evolved over the past decades. Even today, when high performance and high bandwidth wireless communication equipment is made available there is demand for even higher performance at a higher bandwidth.

In many houses, video signals are received through cable or satellite links at a Set-Top Box (STB) located at a fixed point. In many cases, it may be desired to place a screen or projector at a location in a distance of at least a few meters from the STB. This trend is becoming more common as flat-screen displays, e.g., plasma or Liquid Crystal Display (LCD) televisions are hung on a wall. Connection of such a display or projector to the STB through cables is generally undesired for aesthetic reasons and/or installation convenience. Thus, wireless transmission of the video signals from the STB to the screen is preferred.

A video display may display pixels of a video frame according to a pixel video clock. The video display may use video control signals, e.g., a Horizontal Synchronization (Hsync) signal, a Vertical Synchronization (Vsync) signal and/or a Synchronization On Green (SOG) signal, to synchronize between the video pixel clock and a pixel rate of the pixels.

SUMMARY

Some demonstrative embodiments include devices, systems and/or methods of wireless video communication.

Some demonstrative embodiments include a wireless video receiver to receive a wireless video transmission including data representing pixels of a video frame and a synchronization signal indicative of a beginning of the video frame. The wireless receiver may include a clock generator to generate a pixel clock signal synchronized to the synchronization signal, wherein a clock rate of the pixel clock signal corresponds to a pixel rate of the pixels.

In some demonstrative embodiments, the clock generator may include a first clock generation module to generate an intermediate clock signal synchronized to the synchronization signal, wherein an intermediate clock rate of the intermediate clock signal is lower than the pixel rate; and a second clock generation module to generate the pixel clock signal based on the intermediate clock signal.

In some demonstrative embodiments, the clock rate of the pixel clock signal is at least ten times higher than the intermediate clock rate.

In some demonstrative embodiments, the clock rate of the pixel clock signal is at least forty times higher than the intermediate clock rate.

In some demonstrative embodiments, the first clock generation module may include a digital phase-locked loop, and the second clock generation module may include an analog phase-locked loop.

In some demonstrative embodiments, the first clock generation module may include a counter to generate the intermediate clock signal based on a value of the counter; an offset register to maintain an offset value; and an adder to add the offset value to the value of the counter at a system clock rate of a system clock of the receiver.

In some demonstrative embodiments, the wireless video receiver may include an adjuster to adjust the intermediate clock signal based on at least one of the intermediate clock signal and the pixel clock signal.

In some demonstrative embodiments, the synchronization signal may include a transmission synchronization signal to synchronize wireless transmissions between the receiver and a wireless video transmitter.

In some demonstrative embodiments, the synchronization signal may include a synchronization sequence.

In some demonstrative embodiments, the wireless video receiver is capable of generating one or more video control signals based on the pixel clock signal. The video control signals may include at least one of a horizontal-synchronization signal, a vertical synchronization signal, a data enable signal, and a synchronization-on-green signal.

In some demonstrative embodiments, a clock jitter of the pixel clock signal with relation to the pixel rate is no more than five nanoseconds.

In some demonstrative embodiments, the clock jitter is no more than one nanosecond.

In some demonstrative embodiments, the wireless video receiver is capable of generating output pixel data at a latency of no more than two milliseconds, e.g., no more than one millisecond, with respect to the data representing the pixels of the video frame.

Some demonstrative embodiments include a wireless video communication system, which may include a wireless video transmitter to transmit a wireless video transmission including data representing pixels of a video frame and a synchronization signal indicative of a beginning of the video frame; and a wireless video receiver to receive the wireless video transmission. The receiver may include a clock generator to generate a pixel clock signal synchronized to the synchronization signal, wherein a clock rate of the pixel clock signal corresponds to a pixel rate of the pixels.

In some demonstrative embodiments, the clock generator may include a first clock generation module to generate an intermediate clock signal synchronized to the synchronization signal, wherein an intermediate clock rate of the intermediate clock signal is lower than the pixel rate; and a second clock generation module to generate the pixel clock signal based on the intermediate clock signal.

In some demonstrative embodiments, the clock rate of the pixel clock signal is at least ten times higher than the intermediate clock rate.

In some demonstrative embodiments, the clock rate of the pixel clock signal is at least forty times higher than the intermediate clock rate.

In some demonstrative embodiments, the first clock generation module may include a digital phase-locked loop. The second clock generation module may include an analog phase-locked loop.

In some demonstrative embodiments, the first clock generation module may include a counter to generate the intermediate clock signal based on a value of the counter; an offset register to maintain an offset value; and an adder to add the offset value to the value of the counter at a system clock rate of a system clock of the receiver.

In some demonstrative embodiments, the clock generator may include an adjuster to adjust the intermediate clock signal based on at least one of the intermediate clock signal and the pixel clock signal.

In some demonstrative embodiments, the synchronization signal may include a transmission synchronization signal to synchronize wireless transmissions between the receiver and the transmitter.

In some demonstrative embodiments, the synchronization signal may include a synchronization sequence.

In some demonstrative embodiments, a clock jitter of the pixel clock signal with relation to the pixel rate is no more than five nanoseconds.

In some demonstrative embodiments, the clock jitter is no more than one nanosecond.

Some demonstrative embodiments include a method of wireless video communication. The method may include receiving a wireless video transmission including data representing pixels of a video frame and a synchronization signal indicative of a beginning of the video frame; and generating a pixel clock signal synchronized to the synchronization signal, wherein a clock rate of the pixel clock signal corresponds to a pixel rate of the pixels.

In some demonstrative embodiments, generating the pixel clock may include generating an intermediate clock signal synchronized to the synchronization signal, wherein an intermediate clock rate of the intermediate clock signal is lower than the pixel rate; and generating the pixel clock signal based on the intermediate clock signal.

In some demonstrative embodiments, the method may include synchronizing wireless transmissions between a wireless video receiver and a wireless video transmitter based on the synchronization signal.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. Moreover, some of the blocks depicted in the drawings may be combined into a single function. The figures are listed below.

DETAILED DESCRIPTION

Figure 1:
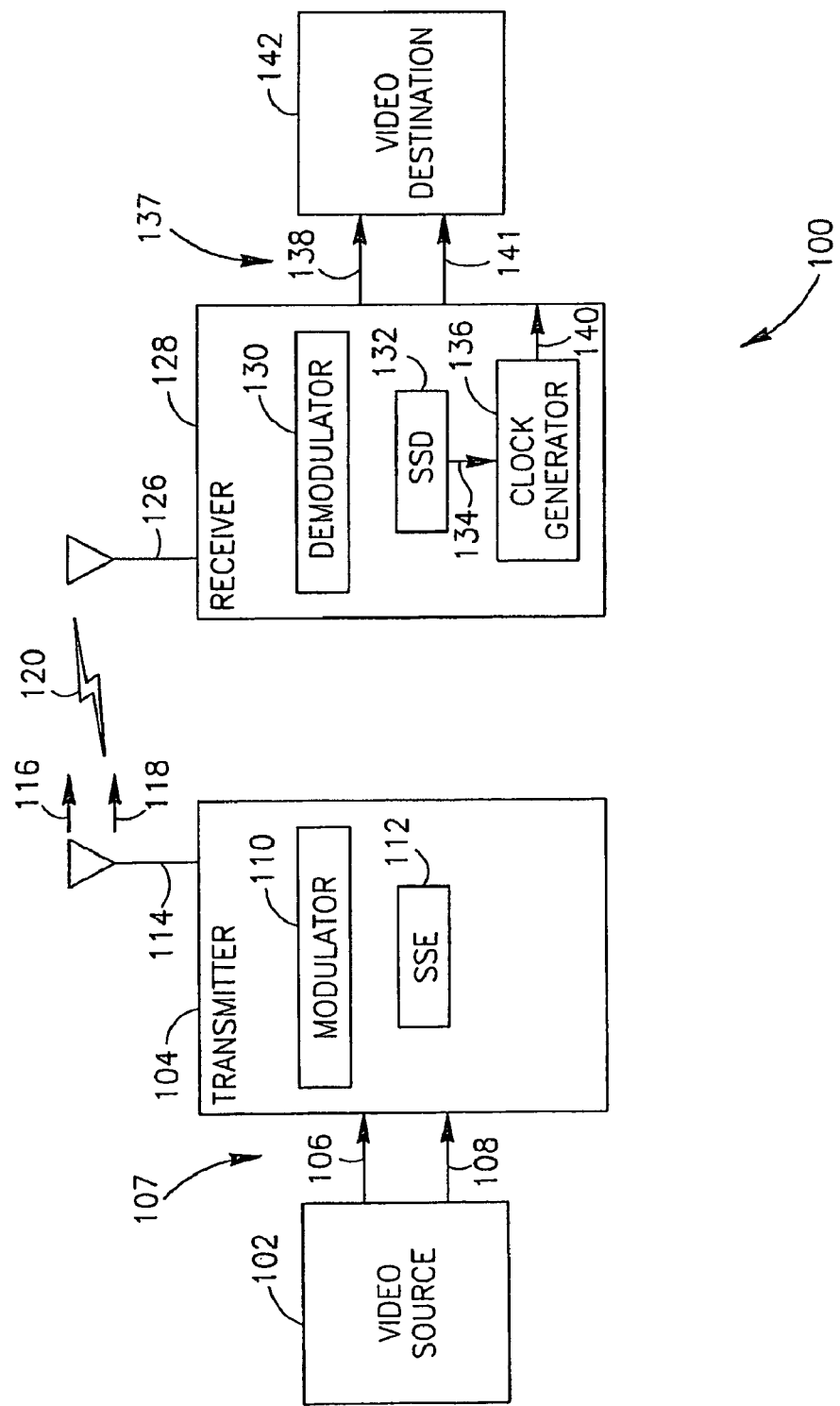
FIG. 1 is a schematic illustration of a wireless video communication system, in accordance with some demonstrative embodiments.

In the following detailed description, numerous specific details are set forth in order to provide a thorough understanding of some embodiments. However, it will be understood by persons of ordinary skill in the art that embodiments of the invention may be practiced without these specific details. In other instances, well-known methods, procedures, components, units and/or circuits have not been described in detail so as not to obscure the discussion.

Unless specifically stated otherwise, as apparent from the following discussions, it is appreciated that throughout the specification discussions utilizing terms such as "processing," "computing," "calculating," "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices. In addition, the term "plurality" may be used throughout the specification to describe two or more components, devices, elements, parameters and the like.

It should be understood that some embodiments may be used in a variety of applications. Although embodiments of the invention are not limited in this respect, one or more of the methods, devices and/or systems disclosed herein may be used in many applications, e.g., civil applications, military applications or any other suitable application. In some demonstrative embodiments the methods, devices and/or systems disclosed herein may be used in the field of consumer electronics, for example, as part of any suitable television, video Accessories, Digital-Versatile-Disc (DVD), multimedia projectors, Audio and/or Video (A/V) receivers/transmitters, gaming consoles, video cameras, video recorders, and/or automobile A/V accessories. In some demonstrative embodiments the methods, devices and/or systems disclosed herein may be used in the field of Personal Computers (PC), for example, as part of any suitable desktop PC, notebook PC, monitor, and/or PC accessories. In some demonstrative embodiments the methods, devices and/or systems disclosed herein may be used in the field of professional A/V, for example, as part of any suitable camera, video camera, and/or A/V accessories. In some demonstrative embodiments the methods, devices and/or systems disclosed herein may be used in the medical field, for example, as part of any suitable endoscopy device and/or system, medical video monitor, and/or medical accessories. In some demonstrative embodiments the methods, devices and/or systems disclosed herein may be used in the field of security and/or surveillance, for example, as part of any suitable security camera, and/or surveillance equipment. In some demonstrative embodiments the methods, devices and/or systems disclosed herein may be used in the fields of military, defense, digital signage, commercial displays, retail accessories, and/or any other suitable field or application.

Although embodiments of the invention are not limited in this respect, one or more of the methods, devices and/or systems disclosed herein may be used to wirelessly transmit video signals, for example, High-Definition-Television (HDTV) signals, between at least one video source and at least one video destination. In other embodiments, the methods, devices and/or systems disclosed herein may be used to transmit any other suitable signals, e.g., between any suitable source and destination.

Reference is made to FIG. 1, which schematically illustrates a wireless video communication system 100 in accordance with some demonstrative embodiments.

In some demonstrative embodiments, system 100 may include a wireless video transmitter 104 to transmit a wireless video transmission 120 based on video signals 107 received from a video source 102. Video source 102 may include any suitable software and/or hardware to generate signals 107, e.g., as described below.

In some demonstrative embodiments, signals 107 may include pixel data 106 corresponding to pixels of a sequence of video frames, and one or more control signals 108. Video source 102 may generate pixel data 106 representing pixels of a video frame at a predefined rate ("the pixel rate"). The pixel rate may be based, for example, on a frame rate of the sequence of video frames and a predefined number of pixels representing each video frame. For example, the pixel rate may be determined by the product of the number of pixels per frame and the frame rate. In one example, the pixel rate of pixel data 106 may be 1650×750×60=74.25 Mega Hertz (MHz) if, for example, the video frame includes pixels arranged in 750 lines and 1650 rows, and the frame rate is 60 hertz (Hz), e.g., in accordance with a 720p progressive scanning video format. The pixel rate may include any other suitable pixel rate in accordance, for example, with any suitable video format, standard, and or specification, e.g., a 1080 p progressive scanning video format, or any other format, e.g., as listed below in Table 1.

In some demonstrative embodiments, control signals 108 may include, for example, a Horizontal Synchronization (Hsync) signal, a Vertical synchronization (Vsync) signal, Synchronization On Green (SOG) signal, a Data Enable (DE) signal, a pixel clock signal, and/or any other suitable synchronization, clock and/or control signal.

In some demonstrative embodiments, transmission 120 may include, for example, data 116 representing pixels of a video frame, and a synchronization signal 118 indicative of a beginning of the video frame, for example, a Start Of Frame (SOF) of the video frame. Synchronization signal 118 may be generated, for example, based on control signals 108, e.g., as described below. Transmission 120 may also include, e.g., as part of a header of transmission 120, information corresponding to a video format, protocol or standard of transmission 120 ("the format information").

In some demonstrative embodiments, transmitter 104 may include a modulator 110 to modulate data 116 according to any suitable modulation scheme. Transmitter 104 may include at least one antenna 114 to transmit transmission 120. Transmitter 104 may implement any suitable transmission method and/or configuration to transmit transmission 120. Although embodiments of the invention are not limited in this respect, in some demonstrative embodiments, transmitter 104 may generate transmission 120 according to an Orthogonal-Division-Frequency-Multiplexing (OFDM) modulation scheme. According to other embodiments, transmitter 104 may generate transmission 120 according to any other suitable modulation and/or transmission scheme.

In some demonstrative embodiments, transmission 120 may include a Multiple-Input-Multiple-Output (MIMO) transmission. For example, modulator 110 may modulate data 116 according to a suitable MIMO modulation scheme; and at least one antenna 114 may include a plurality of antennas.

Although embodiments of the invention are not limited in this respect, in some demonstrative embodiments transmitter may generate transmission 120, wherein data 116 includes at least one coarse constellation symbol representing a first component of a data value of pixel data 106, and at least one fine constellation symbol representing a second component of the data value, for example, by applying a de-correlating transformation, e.g., a Discrete-Cosine-Transformation (DCT), to signals 106, e.g., as described in U.S. patent application Ser. No. 11/551,641, entitled "Apparatus and method for uncompressed, wireless transmission of video", filed Oct. 20, 2006, and published May 3, 2007, as US Patent Application Publication US 2007-0098063 ("the '641 Application"), the entire disclosure of which is incorporated herein by reference.

In some demonstrative embodiments, system 100 may include a wireless video receiver 128 having at least one antenna 126 to receive transmission 120. Receiver 128 may demodulate transmission 120, and generate output signals 137, which may be provided to a video destination 142. Video destination 142 may include any suitable software and/or hardware to handle signals 137 in any suitable manner, e.g., as described below. Output signals 137 may include pixel data 138, e.g., corresponding to pixel data 106, and one or more control signals 141 corresponding to a pixel clock signal 140, e.g., as described below. In one example, control signals 141 may include pixel clock signal 140. In another example, control signals 141 may include, for example, a Hsync signal, a Vsync signal, a SOG signal, a DE signal, a pixel clock signal, and/or any other suitable synchronization, clock and/or control signal corresponding to pixel clock signal 140.

In some demonstrative embodiments, receiver 128 may implement any suitable reception method and/or configuration to receive transmission 120. Although embodiments of the invention are not limited in this respect, in some demonstrative embodiments, receiver 128 may receive and/or demodulate transmission 120 according to an OFDM modulation scheme. According to other embodiments, receiver 128 may receive and/or demodulate transmission 120 according to any other suitable modulation and/or transmission scheme.

In some demonstrative embodiments, receiver 128 may include a demodulator 130 to demodulate transmission 120. For example, demodulator 128 may demodulate transmission 120 according to a suitable MIMO demodulation scheme.

In some demonstrative embodiments, synchronization signal 118 may include a transmission synchronization signal to synchronize wireless transmissions between receiver 128 and transmitter 104. In one example, transmitter 104 may include a Synchronization Signal Encoder (SSE) 112 to generate synchronization signal 118 based, for example, on signals 107; and receiver 128 may include a Synchronization Signal Detector (SSD) 132 to detect synchronization signal 118 from transmission 120. For example, SSE 112 may include a synchronization sequence encoder to generate synchronization signal 118 including a suitable synchronization sequence; and SSD 132 may include a synchronization sequence decoder to detect the synchronization sequence.

In some demonstrative embodiments, SSE 112 may generate synchronization signal 118 at a rate corresponding to the video frame rate of pixel data 106, e.g., based on control signals 108. As a result, wireless transmission 120 between transmitter 104 and receiver 128 may be synchronized, for example, to the video frame rate of pixel data 106, e.g., such that synchronization signal 118 is transmitted from transmitter 104 to receiver 128 at a beginning of the video frame of data 116. Accordingly, synchronization signal 118 may indicate a beginning of the video frame of data 116.

In some demonstrative embodiments, SSD 132 may generate a synchronization signal 134 synchronized to synchronization signal 118. For example, signal 134 may include a SOF indication signal.

In some demonstrative embodiments, receiver 128 may include a clock generator 136 to generate pixel clock signal 140 synchronized to synchronization signal 118, e.g., based on signal 134. A clock rate of pixel clock signal 140 may correspond to the pixel rate of the pixels of data 116 ("the pixel rate of data 116"), e.g., as described below.

In some demonstrative embodiments, a clock jitter of pixel clock signal 140 with relation to the pixel rate of data 116 may be no more than five nanoseconds, for example, no more than one nanosecond, e.g., as described below.

Although embodiments of the invention are not limited in this respect, in some demonstrative embodiments signals 107 may include any suitable format of video signals. In one example, signals 107 may include HDTV video signals, for example, uncompressed HDTV signals, e.g., in a Digital Video Interface (DVI) format, a High Definition Multimedia Interface (HDMI) format, a Video Graphics Array (VGA) format, a VGA DB-15 format, an Extended Graphics Array (XGA) format, any extension of the above formats, or any other suitable video format. Transmission 120 may include, for example, a HDTV video transmission. According to these embodiments, video source 102 may include any suitable video device or module, for example, a portable video source, a non-portable video source, a Set-Top-Box (STB), a DVD, a digital-video-recorder, a game console, a PC, a portable computer, a Personal-Digital-Assistant (PDA), a Video Cassette Recorder (VCR), a video camera, a cellular phone, a video player, a portable-video-player, a portable DVD player, an MP-4 player, a video dongle, a cellular phone, and the like. Video destination 142 may include any suitable video display and/or receiver capable of handling signals 137. For example, video destination 142 may include a display or screen, e.g., a flat screen display, a Liquid Crystal Display (LCD), a plasma display, a back projection television, a television, a projector, a monitor, an audio/video receiver, a video dongle, and the like.

Although embodiments of the invention are not limited in this respect, types of antennae that may be used for antennas 114 and/or 126 may include but are not limited to internal antenna, dipole antenna, omni-directional antenna, a monopole antenna, an end fed antenna, a circularly polarized antenna, a micro-strip antenna, a diversity antenna and the like.

In some demonstrative embodiments, pixel clock signal 140 may be generated with substantially no drift with respect to the pixel rate of data 116, for example, by adjusting pixel clock signal 140 based on synchronization signal 134, e.g., as described below with reference to FIGS. 3 and 4.

In some demonstrative embodiments, receiver 128 may generate pixel data 138 at a relatively low latency of, for example, less than 2 milliseconds (ms), e.g., less than 1 ms, with respect to data 116. For example, receiver 128 may generate pixel data 138 corresponding to a certain pixel of data 116 no more than 2 ms, e.g., no more than 1 ms, after receiving data 116 corresponding to the certain pixel.

In some demonstrative embodiments, receiver 128 may buffer data 116 corresponding to a relatively small number of pixels of data. The amount of the buffered data may correspond, for example, to a time period of adjusting and/or verifying the synchronization, drift and/or accuracy of pixel clock signal 140, e.g., e.g., as described below with reference to FIGS. 3 and 4. For example, receiver 128 may buffer data 116 corresponding to no more than 10% of the video frame, for example, no more than 20 lines of the video frame, e.g., less than 10 lines of the video frame. In one example, receiver 128 may buffer data 116 corresponding to 8 lines of the video frame.

In some demonstrative embodiments, receiver 128 may generate control signals 141 based on pixel clock signal 140. For example, receiver 128 may generate Vsync, Hsync and/or DE signals of signals 141 based on pixel clock signal 140 and the format information of transmission 120. In one example, the Vsync and/or Hsync may be generated, for example, by counting a required number of pixel clock pulses of signal 140. For example, receiver 128 may generate signals 141 including an Hsync signal every $n_{Hsync}$ pulses of pixel clock signal 140; and/or a Vsync signal every $n_{Vsync}$ pulses of pixel clock signal 140, wherein $n_{Hsync}$ and $n_{Vsync}$ denote the number of pixels per row and frame, respectively, as defined by the format information, e.g., as listed below in Table 1.

Figure 2:
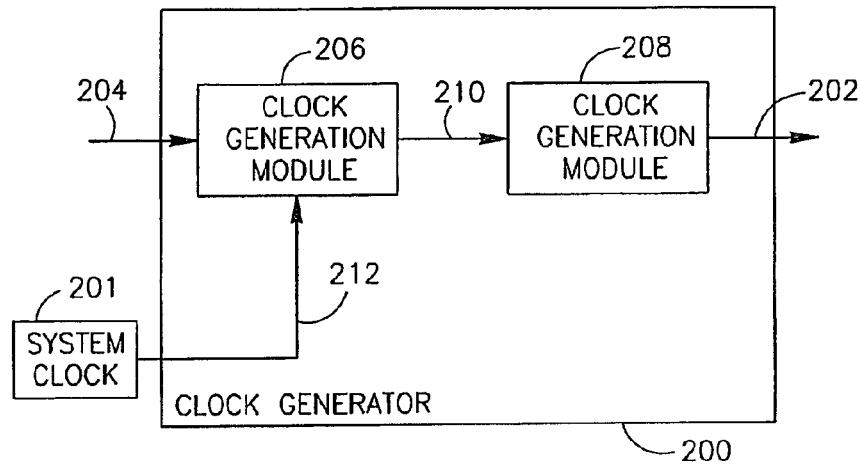
FIG. 2 is a schematic illustration of a clock generator in accordance with some demonstrative embodiments.

Reference is made to FIG. 2, which schematically illustrates a clock generator 200 in accordance with some demonstrative embodiments.

In some demonstrative embodiments, clock generator 200 may generate a pixel clock signal 202 based on a synchronization signal 204. Although embodiments of the invention are not limited in this respect, in some demonstrative embodiments clock generator 200 may perform the functionality of clock generator 136 (FIG. 1). For example, synchronization signal 204 may include synchronization signal 134 (FIG. 1); and/or pixel clock signal 202 may include pixel clock signal 140 (FIG. 1).

In some demonstrative embodiments of the invention, pixel clock signal 202 may have a clock rate, e.g., 74.25 Mhz, corresponding to a pixel rate of a video frame, e.g., the pixel rate of data 106 (FIG. 1), as described above. A rate of synchronization signal 204 may correspond to a rate of the video frame, e.g., 60 Hz, if, for example, synchronization signal 204 is synchronized to the SOF of the video frame, as described above. Accordingly, the clock rate of pixel clock signal 202 may be relatively high compared to the frequency of synchronization signal 204, as described below.

In some demonstrative embodiments, clock generator 200 may include a first clock generation module 206 to generate an intermediate clock signal 210 synchronized to synchronization signal 204, and a second clock generation module 208 to generate pixel clock signal 202 synchronized to intermediate clock signal 210, e.g., as described below.

In some demonstrative embodiments, clock generation module 206 may include a digital Phase-Locked Loop (PLL) to generate signal 210 based on signal 204 and a system clock signal 212 received, for example, from a system clock 201, e.g., as described below with reference to FIG. 3. Clock generation module 208 may include, for example, an analog PLL to generate signal 202 based on signal 210. In one example, system clock signal 212 may have a system clock rate of, for example, 200 MHz, or any other suitable clock rate.

In some demonstrative embodiments, the clock late of pixel clock signal 202 may be N times higher than an intermediate clock rate of intermediate clock signal 210. In one example, the clock rate of pixel clock signal 202 may be at least ten times higher, e.g., at least forty times higher, than the intermediate clock rate. In some demonstrative embodiments, the intermediate clock rate of intermediate clock signal 210 may be M times higher than the frequency of synchronization signal 204. Accordingly, the clock rate of pixel clock signal 202 may be M×N higher than the frequency of synchronization signal 204. For example, pixel clock signal 202 may include M×N pulses between two consecutive pulses of synchronization signal 204.

In some demonstrative embodiments, the product M×N may correspond, for example, to the number of pixels within the video frame of data 106 (FIG. 1) if, for example, synchronization signal 204 is synchronized with the SOF of the video frame, as described above. In one non-limiting example, synchronization signal 204 may have a frequency of 60 Hz, the clock rate of pixel clock signal 202 may be 74.25 MHz, and the product M×N may be equal to 74.25 MHz/60 Hz=1,237,500.

In some demonstrative embodiments, it may be advantageous to implement a minimal value for M and maximal value for N since, for example, it may be advantageous to perform most of the a multiplication of signal 204 by the analog PLL of module 208, which may be more accurate than the digital PLL of module 206. However, the analog PLL of module 208 may require that signal 210 have at least a minimal clock rate, e.g., 1 MHz, which may require than M is at least, for example, $10^6/60 \approx 16,667$.

Figure 3:
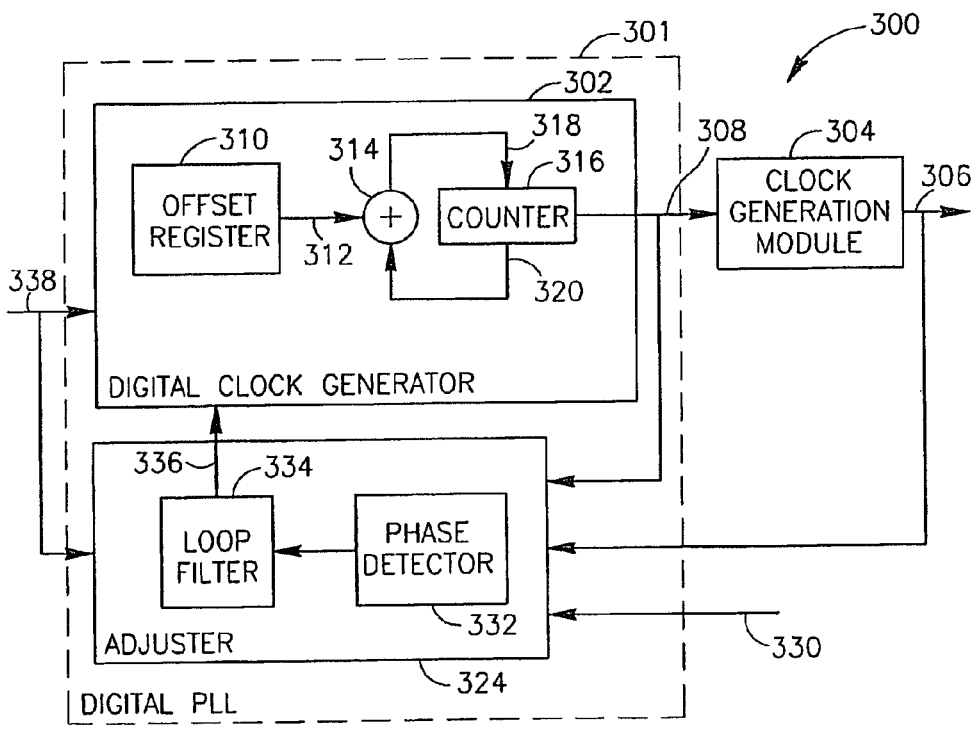
FIG. 3 is a schematic illustration of a clock generator including a clock generation module in accordance with some demonstrative embodiments of the invention.

Reference is now made to FIG. 3, which schematically illustrates a clock generator 300 including a digital PLL 301 in accordance with some demonstrative embodiments of the invention. Although embodiments of the invention are not limited in this respect, in some demonstrative embodiments clock generator 300 may perform the functionality of clock generator 200 (FIG. 2).

In some demonstrative embodiments, digital PLL 301 may include a digital clock generation module 302 to generate an intermediate clock signal 308 based on a system clock signal 338 and a synchronization signal 336, e.g., as described below. Although embodiments of the invention are not limited in this respect, in some demonstrative embodiments digital PLL 301 may perform the functionality of clock generation module 206 (FIG. 2). For example, intermediate clock signal 308 may include intermediate clock signal 210 (FIG. 2), system clock signal 338 may include system clock signal 212 (FIG. 2), and/or synchronization signal 336 may correspond to or may be based on synchronization signal 204 (FIG. 2), e.g., as described below.

In some demonstrative embodiments, intermediate clock signal 308 may be provided to a clock generation module 304, which may generate a pixel clock signal 306. Although embodiments of the invention are not limited in this respect, in some demonstrative embodiments clock generation module 304 may include clock generation module 208 (FIG. 2), and pixel clock signal 306 may include pixel clock signal 202 (FIG. 2).

In some demonstrative embodiments, digital clock generation module 302 may include an offset register 310 to maintain an offset value, denoted offset; a counter 316 to generate clock signal 308 based on a value of counter 316; and an adder 314 to add the offset value to the value of counter 316, as described in detail below.

In some demonstrative embodiments, the offset value may be added to the value of counter 316 at each cycle of system clock 338. Counter 316 may generate clock signal 308, for example, based on a value of counter 316. For example, the offset value may include a fraction, e.g., a value between zero and one; and clock signal 308 may include a Most Significant Bit (MSB) of the value of counter 316. Accordingly, a relation between a rate of clock signal 308, denoted $F_{dig}$, and the rate of system clock 338, denoted $F_s$, may be defined by the offset value, e.g., as follows:

$$F_{dig}=F_s*\text{offset}/2 \qquad (1)$$

For example, if the offset value is 0.25, then the rate of clock 308 may be eight times slower than the rate of system clock 338.

In some demonstrative embodiments, digital clock generation module 302 may generate signal 308 in synchronization with a synchronization signal 336. Synchronization signal 330 may be synchronized with a synchronization signal 330, e.g., as described below. Synchronization signal 330 may be synchronized, for example, to the SOF of the video frame, as described above. Although embodiments of the invention are not limited in this respect, in some demonstrative embodiments synchronization signal 330 may include synchronization signal 204 (FIG. 2).

In some demonstrative embodiments, synchronization signal 330 may indicate the SOF of a video frame. For example, each pulse of signal 330 may indicate a SOF of the video frame, e.g., a rate of signal 330, denoted, $F_{SOF}$, may correspond to the frame rate of the video frames, as described above. Accordingly, the ratio M, as described above, between the rate of signal 308 and the rate of signal 330 may be determined as follows:

$$M=F_{dig}/F_{SOF}=(F_s*\text{offset}/2)/F_{SOF}=L*\text{Offset}/2 \qquad (2)$$

wherein L denotes the number of pulses of system clock 338 between two SOF indications, e.g.:

$$L=F_s/F_{SOF} \qquad (3)$$

Accordingly, the offset value may be determined, for example, as follows:

$$\text{offset}=2*M/L=2*M*F_{SOF}/F_s \qquad (4)$$

In some demonstrative embodiments, one or more parameters of clock generator 300, e.g., the offset value, may be determined based a video format, protocol or standard of a video transmission to be received, for example, video transmission 120 (FIG. 1), e.g., as described below.

In some demonstrative embodiments, one or more parameters of clock generator 300 (FIG. 3), may be determined based on format information corresponding to a video format, protocol or standard of a video transmission to be received, for example, video transmission 120 (FIG. 1). In one example, a header of transmission 120 (FIG. 1) may include the format information, e.g., as described above with reference to FIG. 1. Clock generator In some demonstrative embodiments, the values of M and N may be determined, for example, according to the received format information. For example, clock generator 300 may include one or more predefined sets of the values M and N corresponding to one or more predefined video formats. Clock generator 300 may select a set of the values M and N based, for example, on the format information. The value of L may be determined, for example, according to Equation 3, e.g., based on the system clock rate and the SOF indication of synchronization signal 330; the offset value may be determined based, for example, on Equation 4; and the offset value may be provided to offset register 310, and counter 316 may be enabled to generate 308. Although some demonstrative embodiments are described herein with respect by determining the value of L based on a calculation, e.g., according to Equation 3, other embodiments may include determining the value of L in any other suitable manner, e.g., by measuring the value of L.

In one example, the video data of transmission 120 (FIG. 1) may be formatted according to the 720p standard, e.g., having a video frame rate of 60 Hz. The values of M and N may be set, for example, to M=123,750 and N=10. The system clock 338 may have, for example a rate of 100 MHz. Accordingly, the value of L may be, for example, L=100 e⁶/60=1.667 e⁶. Therefore, the offset value may be determined to be offset=2M/L=2*123,750/1.667 e⁶=0.1485.

In some demonstrative embodiments, the calculation of the value L may not be accurate, e.g., since the value of L may be based on synchronization signal 330, and/or since the value of L may be represented as a fixed-point value.

In some demonstrative embodiments, PLL 301 may also include an adjuster to adjust signal 308, e.g., by adjusting the offset value, based for example, on a relationship between signal 330 and a feedback clock signal, e.g., as described below.

In some demonstrative embodiments, the feedback clock signal may include signal 306. For example, adjuster 324 may adjust the offset value based on a relationship between signal 306 and signal 330. For example, the number of clock pulses of signal 306 may be between each two SOF indications of signal 330 may be compared to a predefined pixel clock rate corresponding to the format information. The offset value may be increased and/or decreased based on a difference between the number of clock pulses of signal 306 and the predefined pixel clock rate corresponding to the format information.

In some demonstrative embodiments, the feedback clock signal may include signal 308. For example, the offset value may be adjusted such that the rate of signal 306 may correspond to the predefined pixel clock rate in a next video frame.

In some demonstrative embodiments, adjuster 324 may be implemented using a phase detector 332, and a loop filter 334, e.g., as described below. In other embodiments, adjuster 324 may include any other suitable implementation.

Figure 4:
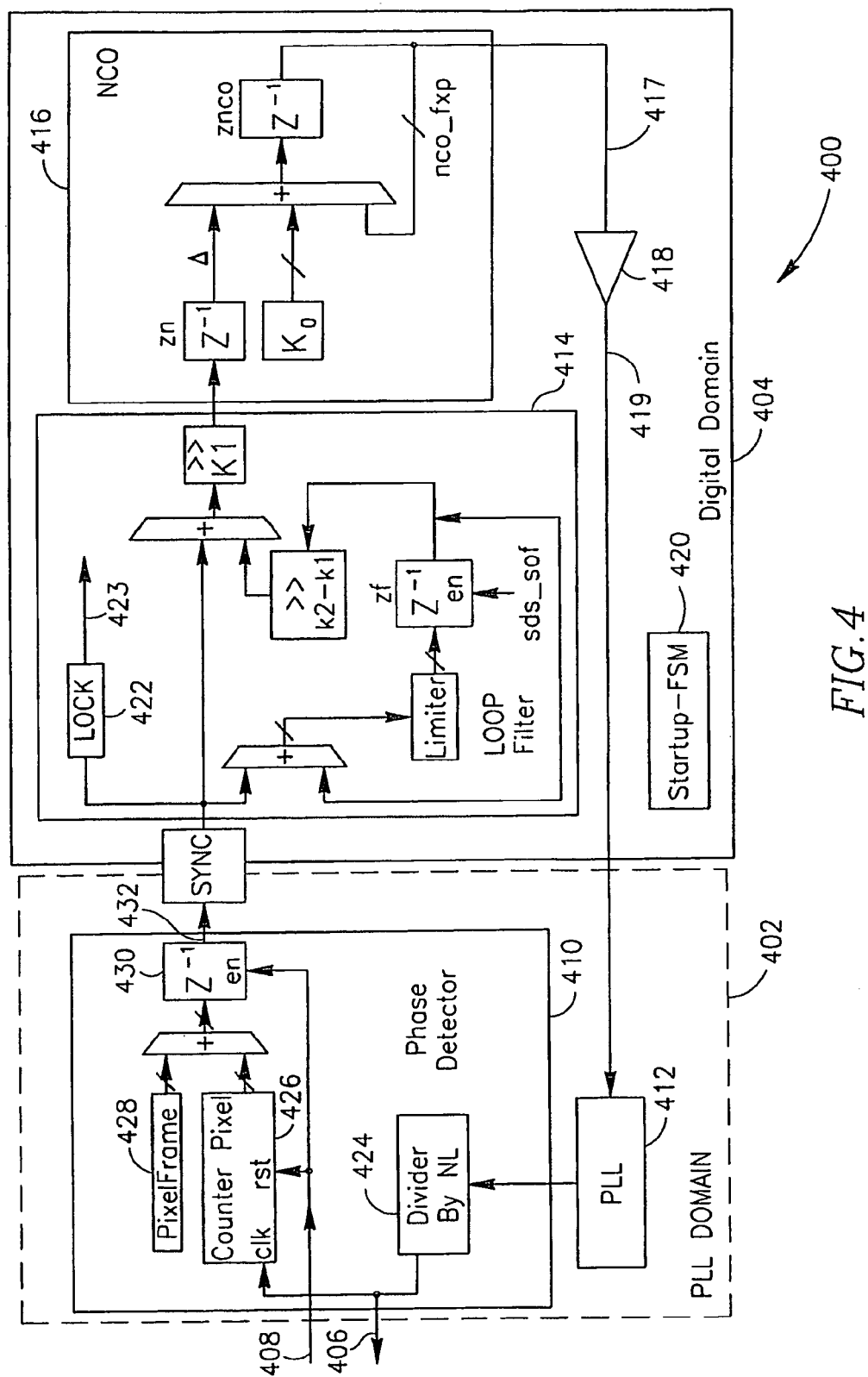
FIG. 4 is a schematic illustration of a clock generator configuration in accordance with one demonstrative embodiment.

Reference is made to FIG. 4, which schematically illustrates a clock generator configuration 400 in accordance with one demonstrative embodiment. Although embodiments of the invention are not limited in this respect, clock generator 400 may perform the functionality of clock generator 300.

In some demonstrative embodiments, clock generator 400 may generate a pixel clock signal 406, which may be synchronized to a synchronization signal 408. One or more elements of clock generator 400 may be implemented in an analog domain 402, and one or more elements of clock generator 400 may be implemented in a digital domain 404, as described in detail below.

In some demonstrative embodiments, domain 402 may include a phase detector 410 and an analog PLL 412; and domain 404 may include a startup Finite State Machine (FSM), a lock module 422, a second-order loop Filter 414, and a Numerically Controlled Oscillator (NCO) 416.

In some demonstrative embodiments, phase detector 410 may include a divider 424, a pixel counter 426, a pixel frame register 428 and an unsigned subtractor 430. Divider 424 may include, for example, a fixed divider by 2. Pixel counter 426 may count a number of pixel clocks between consecutive pulses of signal 408, e.g., using signal 406 as a clock. Pixel frame register 428 may be loaded with a constant value representing the number of pixels per frame, e.g., based on the format information of transmission 120 (FIG. 1). When signal 408 is active, subtractor 430 may provide a phase error 432 corresponding to a difference between a value of pixel frame resister 428 and a value of pixel counter 426.

In some demonstrative embodiments, loop filter 414 may filter phase error 432, e.g., based on first and second filter coefficients, denoted K1 and K2, respectively, e.g., K1=3 and K2=4.

In some demonstrative embodiments, NCO 416 may generate a digital clock signal 417 having a frequency, denoted $F_d$, e.g., as follows:

$$F_d = \frac{(K_0 + \Delta)}{2^{N_{dvco}}} \cdot F_S \qquad (5)$$

wherein $N_{dvco}$ denotes a number of accumulator bits, $K_0$ denotes an initial frequency, and $\Delta$ denotes an adjustment frequency applied to $K_0$, e.g., offset=$K_0+\Delta$. The value of $K_0$ may be determined, for example, based on the format information of transmission 120 (FIG. 1), e.g., as listed below in Table 1.

In some demonstrative embodiments, a MSB extractor 418 may extract an MSB of NCO 416 to generate an intermediate clock signal 419.

In some demonstrative embodiments, lock module 422 may assert a lock PLL signal 423, e.g., when PLL clock synchronization is locked. Startup FSM 420 may be capable of controlling the operation of elements of domain 404, e.g., using any suitable state-machine algorithm.

Referring back to FIG. 4, in some demonstrative embodiments, PLL 412 may include any suitable analog PLL, e.g., a TSMC Macro-Cell PG13E3G-210a, 400 Mhz PLL; a CYPRESS CY22150 PLL, and the like.

In some demonstrative embodiments, one or more parameters of clock generator 400 may be defined in accordance with a format of the received video frame, e.g., in accordance with the format information of transmission 120 (FIG. 1), for example, as follows:

TABLE 1

| Format | Vertical (lines/frame) | Horizontal (Pixels/line) | Pixels per frame | K0 | Pixel clock (MHz) | N0 | Fref (MHz) | FVCO (MHz) |
|---|---|---|---|---|---|---|---|---|
| Video format 1 60 Hz | 525 | 800 | 420000 | 2113929 | 25.2 | 4 | 3.2 | 201.6 |
| Video format 2, 3 60 Hz | 525 | 858 | 450450 | 2267189 | 27.027 | 4 | 3.4 | 216.22 |
| Video format 4 60 Hz | 750 | 1650 | 1237500 | 3114271 | 74.25 | 2 | 4.6 | 297 |
| Video format 5 60 Hz | 1125 | 2200 | 2475500 | 3114271 | 74.25 | 2 | 4.6 | 297 |
| Video format 6, 7 60 Hz | 525 | 1716 | 900900 | 2267189 | 27.027 | 4 | 3.4 | 216.22 |

TABLE 1-continued

| Format | Vertical (lines/frame) | Horizontal (Pixels/line) | Pixels per frame | K0 | Pixel clock (MHz) | N0 | Fref (MHz) | FVCO (MHz) |
|---|---|---|---|---|---|---|---|---|
| Video format 8, 9 60 Hz | 262 | 1716 | 449592 | 2267189 | 27.027 | 4 | 3.4 | 216.22 |
| Video format 8, 9 60 Hz | 263 | 1716 | 451308 | 2267189 | 27.027 | 4 | 3.4 | 216.22 |
| Video format 12, 13 60 Hz | 262 | 3432 | 899184 | 2267189 | 54.054 | 2 | 3.4 | 216.22 |
| Video format 12, 13 60 Hz | 263 | 3432 | 902616 | 2267189 | 54.054 | 2 | 3.4 | 216.22 |
| Video format 17, 18 50 Hz | 625 | 864 | 540000 | 2264924 | 27 | 4 | 3.4 | 216 |
| Video format 19 50 Hz | 750 | 1980 | 1485000 | 3114271 | 74.25 | 2 | 4.6 | 297 |
| Video format 20 50 Hz | 1125 | 2640 | 2970000 | 3114271 | 74.25 | 2 | 4.6 | 297 |
| Video format 21, 22 50 Hz | 625 | 1728 | 1080000 | 2264924 | 27 | 4 | 3.4 | 216 |
| 1080 p 30 Hz | 1125 | 2200 | 2475000 | 3114271 | 74.25 | 2 | 4.6 | 297 |
| 1080 p 23.97 Hz | 1125 | 2750 | 3093750 | 3111156 | 74.175 | 2 | 4.6 | 296.7 |
| PC 640 * 480 60 Hz | 525 | 800 | 420000 | 527958 | 25.175 | 4 | 3.1 | 201.4 |
| PC 640 * 480 75 Hz | 500 | 840 | 420000 | 660603 | 31.5 | 4 | 3.9 | 252 |
| PC 800 * 600 60 Hz | 628 | 1056 | 663168 | 838861 | 40 | 4 | 5.0 | 320 |
| 800 * 600 75 Hz | 625 | 1056 | 660000 | 1038090 | 49.5 | 4 | 6.2 | 396 |
| PC 1024 * 768 60 Hz | 806 | 1344 | 1083264 | 681574 | 65 | 2 | 4.1 | 260 |
| PC 1024 * 768 75 Hz | 800 | 1312 | 1049600 | 825754 | 78.75 | 2 | 4.9 | 315 | wherein N0 denotes a PLL-post divider parameter for PLL 412, $F_{VCO}$ denotes a Voltage Controlled Oscillator (VCO) frequency of PLL 412 before post division, and $F_{ref}$ denotes a frequency of an input of PLL 412.

Figure 5:
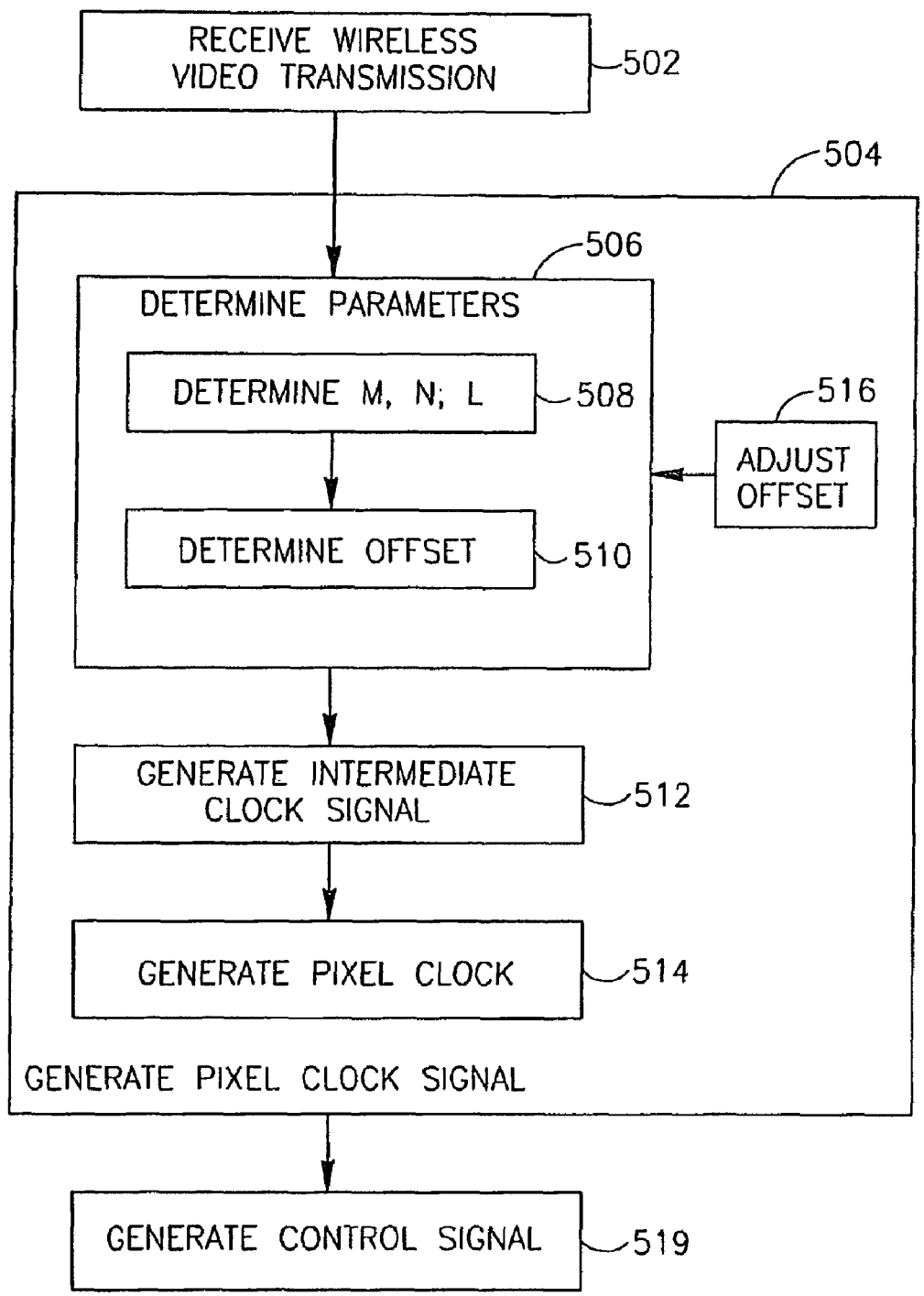
FIG. 5 is a schematic flow-chart illustration of a method of generating a pixel clock signal in accordance with some demonstrative embodiments.

Reference is also made to FIG. 5, which schematically illustrates a method of generating a pixel clock signal in accordance with some demonstrative embodiments. Although embodiments of the invention are not limited in this respect, in some demonstrative embodiments one or more operations of the method of FIG. 5 may be implemented by a system, e.g., system 100 (FIG. 1), a transmitter, e.g., transmitter 104 (FIG. 1), a receiver, e.g., receiver 128 (FIG. 1), and/or a clock generator, e.g., clock generator 136 (FIG. 1), to generate a clock pixel signal, e.g., clock pixel signal 140 (FIG. 1), based on a wireless video transmission, e.g., transmission 120 (FIG. 1).

As indicated at block 502, the method may include receiving a wireless video transmission including data representing a video frame and a synchronization signal indicative of a beginning of the video frame. For example, receiver 128 (FIG. 1) may receive transmitter 104 (FIG. 1) transmission 120 (FIG. 1) including synchronization signal 118 (FIG. 1), e.g., as described above.

As indicated at block 504, the method may include generating a pixel clock signal synchronized to the synchronization signal, wherein a clock rate of the pixel clock signal corresponds to a pixel rate of the video frame. For example, clock generator 136 (FIG. 1) may generate pixel clock signal 140 (FIG. 1), e.g., as described above.

As indicated at block 506, the method may include determining one or more parameters of the clock generator, e.g., based on a video format, protocol or standard of a the video transmission. As indicated at block 508, the method may include determining the value M, N and/or L. For example, clock generator 136 may determine the values of M, N and/or L based on the format information of transmission 120 (FIG. 1), e.g., as described above. As indicated at block 510, the method may include determining the offset value based, for example, on the values M, N and/or L, e.g., as described above.

As indicated at block 512, the method may include generating an intermediate clock signal synchronized to the synchronization signal. An intermediate clock rate of the intermediate clock signal may be lower than the pixel rate. For example, clock generation module 206 (FIG. 2) may generate intermediate signal 210 (FIG. 2) based on synchronization signal 204 (FIG. 2), e.g., as described above.

As indicated at block 514, the method may also include generating the pixel clock signal based on the intermediate clock signal. For example, clock generation module 208 (FIG. 2) may generate pixel clock signal 202 (FIG. 2) based on intermediate clock signal 210 (FIG. 2), e.g., as described above.

As indicated at block 519, the method may also include generating one or more output control signals based on the pixel clock signal. For example, receiver 128 (FIG. 1) may generate signals 141, e.g., including Hsync, Vsync signals, and/or any other signals, based on pixel clock signal 140 (FIG. 1).

Some embodiments may be implemented by software, by hardware, or by any combination of software and/or hardware as may be suitable for specific applications or in accordance with specific design requirements. Some embodiments may include units and sub-units, which may be separate of each other or combined together, in whole or in part, and may be implemented using specific, multi-purpose or general processors, or devices as are known in the art. Some embodiments may include buffers, registers, storage units and/or memory units, for temporary or long-term storage of data and/or in order to facilitate the operation of a specific embodiment.

While certain features of the invention have been illustrated and described herein, many modifications, substitutions, changes, and equivalents may occur to those of ordinary skill in the art. It is, therefore, to be understood that the appended claims are intended to cover all such modifications and changes as fall within the true spirit of the invention.

What is claimed is:

1. A wireless video receiver to receive a wireless video transmission including data associated with pixels of a video frame and a synchronization signal indicative of a beginning of said video frame, said wireless receiver comprising: a multistage clock generator to generate a pixel clock signal at least partially based on the synchronization signal;
   wherein said clock generator comprises: (1) a first clock generation module to generate an intermediate clock signal at least partially based on the synchronization signal, and wherein an intermediate clock rate of said intermediate clock signal is lower than the pixel rate; and (2) a second clock generation module to generate the pixel clock signal at least partially based on the intermediate clock signal; and
   wherein said first clock generation module comprises a digital phase-locked loop and said second clock generation module comprises an analog phase-locked loop.

2. The receiver of claim 1, wherein the clock rate of the pixel clock signal is at least ten times greater than said intermediate clock rate.

3. The receiver of claim 1, wherein the clock rate of said pixel clock signal is at least four orders of magnitude greater than said intermediate clock rate.

4. The receiver of claim 1, wherein said first clock generation module comprises: a counter to generate said intermediate clock signal based on a value of said counter; an offset register to maintain an offset value; and an adder to add said offset value to the value of said counter at a system clock rate of a system clock of said receiver.

5. The receiver of claim 4, wherein said clock generator is to adjust the offset value maintained by the offset register based on at least one of said intermediate clock signal and said pixel clock signal.

6. The receiver of claim 1, wherein said wireless video receiver is capable of generating one or more video control signals based on said pixel clock signal, said video control signals comprising at least one of a horizontal-synchronization signal, a vertical synchronization signal, and a synchronization-on-green signal.

7. A wireless video communication system comprising: a wireless video transmitter to transmit a wireless video transmission including data representing pixels of a video frame and a synchronization signal indicative of a beginning of said video frame; and a wireless video receiver to receive said wireless video transmission, said receiver comprising a multistage clock generator to generate a pixel clock signal at least partially synchronized to said synchronization signal;
   wherein a clock rate of said pixel clock signal at least partially corresponds to a pixel rate of said pixels, and wherein said clock generator comprises a first clock generation module to generate an intermediate clock signal at least partially synchronized to said synchronization signal, such that an intermediate clock rate of said intermediate clock signal is lower than said pixel rate;
   further comprising a second clock generation module to generate said pixel clock signal based at least partially on said intermediate clock signal; and
   wherein said first clock generation module comprises a digital phase-locked loop and said second clock generation module comprises an analog phase-locked loop.

8. The system according to claim 7, wherein the clock rate of said pixel clock signal is at least ten times higher than said intermediate clock rate.

9. The system of claim 7, wherein said first clock generation module comprises: a counter to generate said intermediate clock signal based on a value of said counter; an offset register to maintain an offset value; and an adder to add said offset value to the value of said counter at a system clock rate of a system clock of said receiver.

10. The system of claim 7, wherein said clock generator is to adjust the offset value maintained by the offset register based on at least one of said intermediate clock signal and said pixel clock signal.

11. The system of claim 7, wherein said wireless video receiver is capable of generating one or more video control signals based on said pixel clock signal, said video control signals comprising at least one of a horizontal-synchronization signal, a vertical synchronization signal, and a synchronization-on-green signal.

12. A method of wireless video communication, the method comprising: receiving a wireless video transmission including data representing pixels of a video frame and a synchronization signal indicative of a beginning of said video frame; and generating a pixel clock signal synchronized at least partially to said synchronization signal, wherein a clock rate of said pixel clock signal corresponds to a pixel rate of said pixels, and wherein generating said pixel clock comprises two stages; wherein generating a pixel clock includes generating an intermediate clock signal at least partially synchronized to said synchronization signal, and generating said pixel clock signal based on said intermediate clock signal; and wherein generating the intermediate clock signal comprises: generating said intermediate clock signal based on a value of a counter; maintaining an offset value; and adding said offset value to the value of said counter at a system clock rate of a system clock.

* * * * *